United States Patent
Ichihara

(10) Patent No.: US 8,995,565 B2
(45) Date of Patent: Mar. 31, 2015

(54) DISTORTION CONTROL DEVICE AND METHOD

(75) Inventor: Masaki Ichihara, Tokyo (JP)

(73) Assignee: Lenovo Innovations Limited (Hong Kong), Quarry Bay (HK)

( * ) Notice: Subject to any disclaimer, the term of this patent is extended or adjusted under 35 U.S.C. 154(b) by 912 days.

(21) Appl. No.: 12/300,745

(22) PCT Filed: May 17, 2007

(86) PCT No.: PCT/JP2007/060123
§ 371 (c)(1),
(2), (4) Date: Nov. 13, 2008

(87) PCT Pub. No.: WO2007/132916
PCT Pub. Date: Nov. 22, 2007

(65) Prior Publication Data
US 2009/0202017 A1    Aug. 13, 2009

(30) Foreign Application Priority Data
May 17, 2006  (JP) ................................. 2006-137149

(51) Int. Cl.
*H04L 25/49* (2006.01)
*H03G 3/30* (2006.01)
(Continued)

(52) U.S. Cl.
CPC ............. *H03G 3/3047* (2013.01); *H03G 3/004* (2013.01); *H03G 3/3042* (2013.01); *H04B 1/0475* (2013.01); *H04B 2201/70706* (2013.01)
USPC ........ 375/296; 375/295; 375/297; 455/114.2; 455/114.3; 455/127.1; 455/127.2

(58) Field of Classification Search
USPC ............ 375/285, 295–315; 455/127.1–127.2, 455/522, 39, 500–501, 63.1, 91, 455/114.2–114.3
See application file for complete search history.

(56) References Cited

U.S. PATENT DOCUMENTS

| 6,914,943 B2 * | 7/2005 | Shimizu ......................... 375/302 |
| 2005/0186923 A1 * | 8/2005 | Chen et al. ................. 455/127.1 |

(Continued)

FOREIGN PATENT DOCUMENTS

| JP | 2004120271 A | 4/2004 |
| JP | 2005150814 A | 6/2005 |

(Continued)

OTHER PUBLICATIONS

"Comparison of PAR and Cubic Metric for Power De-rating", May 10-14, 2004, Motorola, R1-040642.*

(Continued)

*Primary Examiner* — Vineeta Panwalkar
*Assistant Examiner* — Janice Tieu
(74) *Attorney, Agent, or Firm* — Sughrue Mion, PLLC

(57) ABSTRACT

This invention includes a waveform analyzing means (13) for calculating an estimated value of a back-off value required by a power amplifier (2), which amplifies a high-frequency signal generated from a baseband signal (I, Q) to a predetermined transmission power, by analyzing the waveform of the baseband signal (I, Q), and a control means (14) for controlling at least one of the amplitude of high-frequency power input to the power amplifier (2) and the supply power of the power amplifier (2) on the basis of the estimated value. The invention calculates the estimated value of a back-off value by analyzing the waveform of a baseband in this manner, and hence need not generate a table in advance by calculating a back-off value for each combination of code channels. The invention can therefore be applied to even a case in which the number of code channels greatly increases, and can effectively prevent an increase in adjacent channel leakage power due to a signal obtained by multiplexing these code channels.

14 Claims, 11 Drawing Sheets

(51) Int. Cl.
*H03G 3/00* (2006.01)
*H04B 1/04* (2006.01)

(56) References Cited

U.S. PATENT DOCUMENTS

| 2006/0068830 A1* | 3/2006 | Klomsdorf et al. ............ 455/522 |
| 2007/0155335 A1* | 7/2007 | Love et al. ..................... 455/522 |
| 2007/0184791 A1* | 8/2007 | Vinayak et al. ............ 455/127.1 |

FOREIGN PATENT DOCUMENTS

| JP | 2005252388 A | 9/2005 |
| JP | 2005318266 A | 11/2005 |
| JP | 2007243927 A | 9/2007 |
| WO | 2005053151 A | 6/2005 |
| WO | WO 2005053151 A1 * | 6/2005 |

OTHER PUBLICATIONS

Japanese Office Action for JP2008-515599 issued Apr. 26, 2011.

International Search Report for PCT/JP2007/060123 mailed Jul. 24, 2007.

* cited by examiner

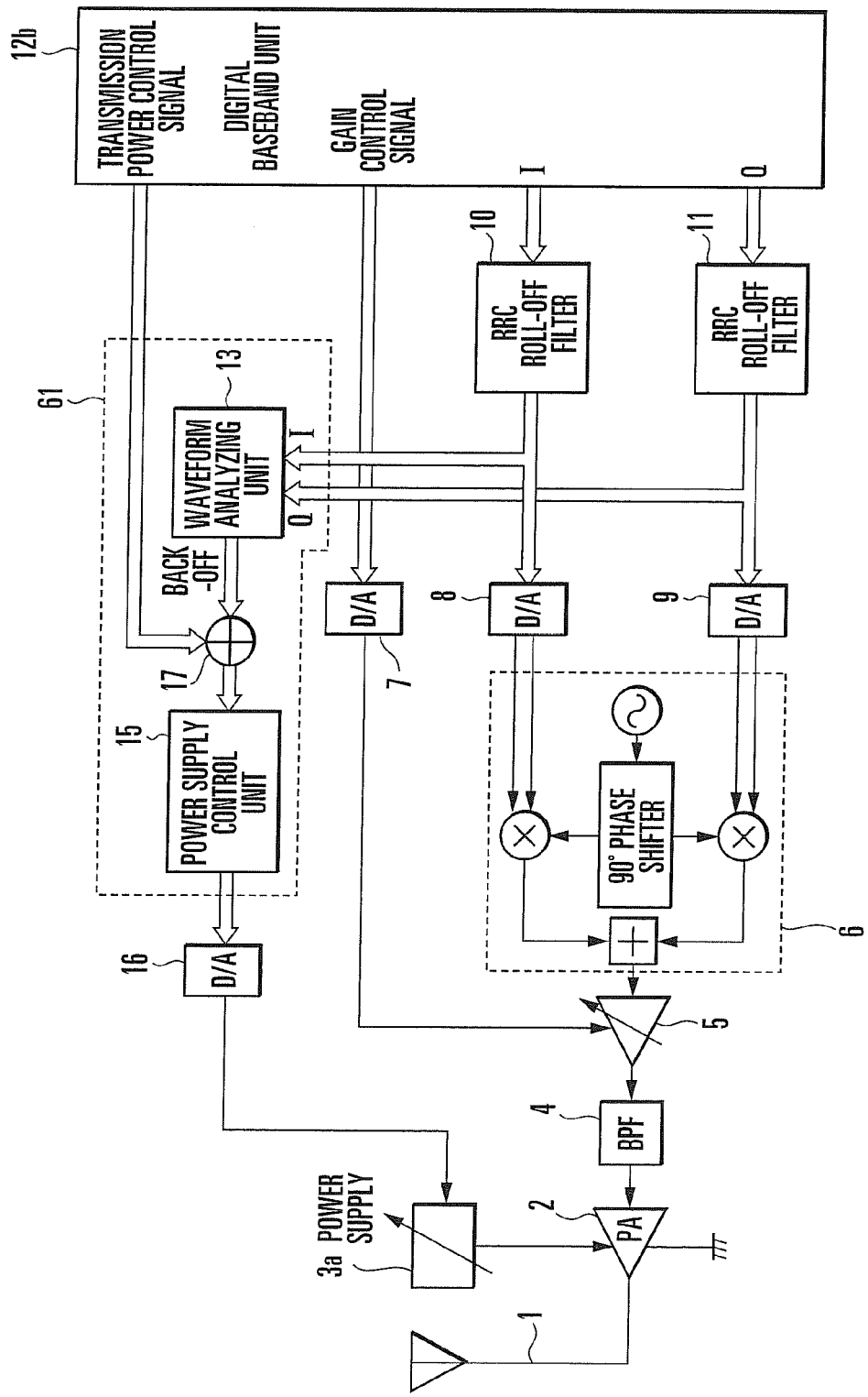
F I G. 7

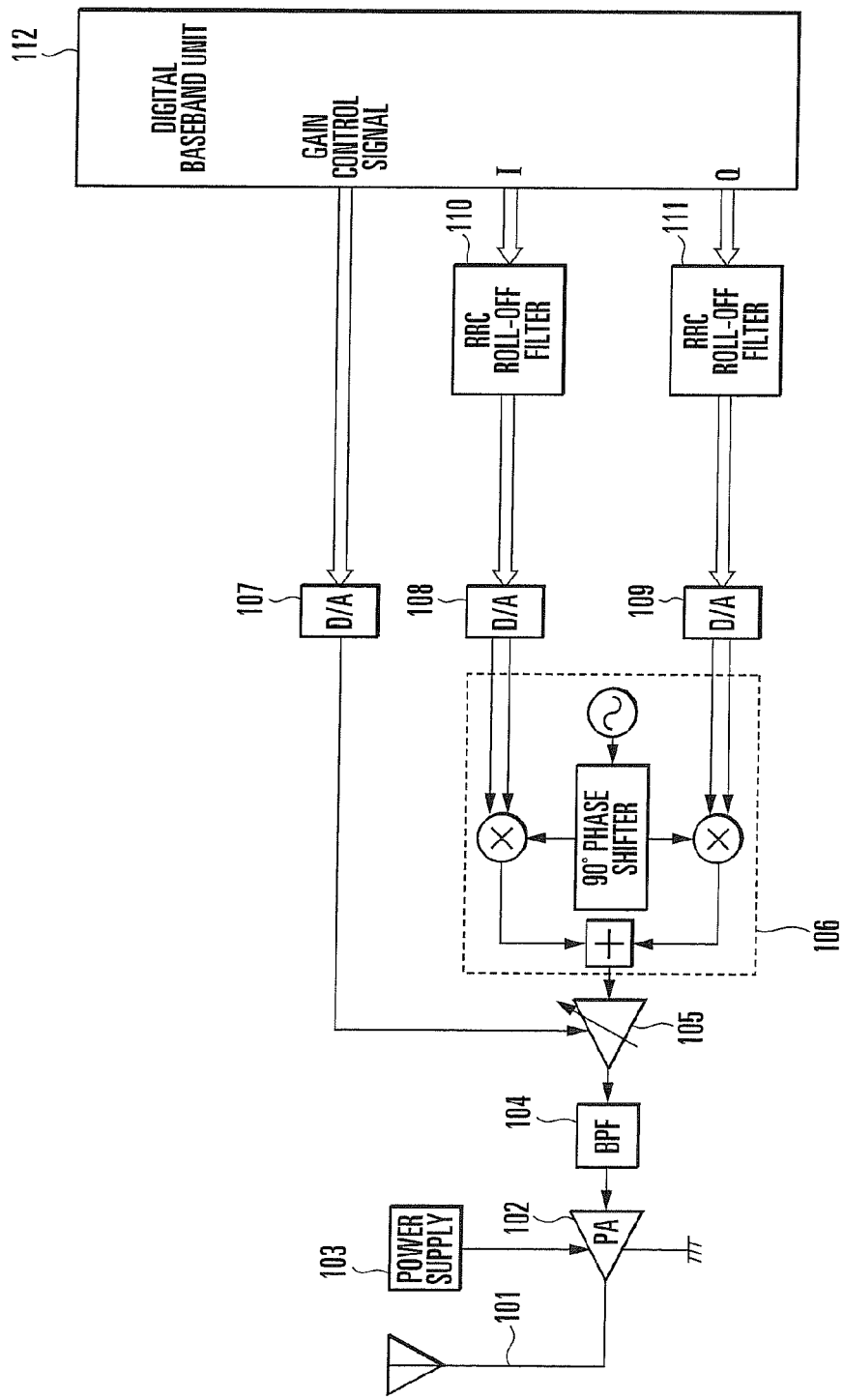
F I G. 9
-- PRIOR ART --

-- PRIOR ART --

… (1)

DISTORTION CONTROL DEVICE AND METHOD

TECHNICAL FIELD

The present invention relates to a distortion control device and method.

BACKGROUND ART

The transmission-side circuit arrangement of a mobile terminal apparatus based on a general W-CDMA scheme will be described with reference to FIG. 9. A baseband signal comprises an in-phase component (to be referred to as an I signal) and a quadrature component (to be referred to as a Q signal) in quadrature modulation. A digital baseband unit 112 generates this signal. RRC (Raised Root Cosine) roll-off filters 110 and 111 for waveform shaping band-limit the I and Q signals. The processing so far is digital signal processing.

D/A converters 108 and 109 then respectively convert the I and Q signals into analog signals. A known quadrature modulator 106 performs quadrature modulation for a local signal with these analog signals. The high-frequency signal generated as a result of this operation is input to a variable gain amplifier (VGA) 105, which then amplifies it to a predetermined level in accordance with the gain control signal output from the digital baseband unit 112 or the analog signal converted from the gain control signal by a D/A converter 107.

The high-frequency signal amplified by the variable gain amplifier 105 contains many spurious components. A band-pass filter (BPF) 104 removes these spurious components. The resultant high-frequency signal is then amplified by a power amplifier (PA) 102 and transmitted from an antenna 101. Although a power supply 103 drives the power amplifier 102, FIG. 9 shows the voltage of the power supply 103 as a fixed voltage.

FIG. 10 shows the arrangement of a circuit for generating a baseband signal in a currently commercialized W-CDMA (referred to as R99: Release 99) mobile terminal apparatus. Reference symbol DPCCH denotes a control channel, which is a binary signal of ±1. A multiplier 133 multiplies this signal by a spreading code Cc (which is also a binary signal of ±1). A multiplier 134 then multiplies the signal by a weighting factor βc. On the other hand, reference symbol DPDCH denotes a data channel, which is a binary signal of ±1 as in the case with DPCCH. A multiplier 130 multiplies this signal by a spreading code Cd (which is also a binary signal of ±1). A multiplier 131 then multiplies the resultant signal by a weighting factor βd.

In the R99 system, a baseband signal comprises only these two-system signals in reality. A scrambler 138 multiplies this signal by a scramble code, and then outputs real and imaginary parts as I and Q signals, respectively. Reference numerals 132 and 135 denote combiners; 136, a multiplier which multiplies j representing an imaginary number; and 137, an adder which adds a real part and an imaginary part.

FIG. 11A shows the constellation of baseband signals (loci on an IQ plane) after they pass through the RRC roll-off filters 110 and 111. Referring to FIG. 11A, the ratios between the values of weighting factors β are βc=8/15 and βd=15/15. In the constellation chart, the white dotted line circle is a circle whose radius is defined by the RMS (root mean square) value of signal amplitudes, and the black solid line circle is a circle whose radius is defined by a peak value. According to R99, since the number of code channels constituting a baseband is only two, i.e., DPCCH and DPDCH, the ratio (PAR: Peak Average Ratio) between the peak value and the RMS value is small. When this value is represented by dB, the resultant value is about 3.3 dB at most.

FIG. 12 shows the arrangement of a circuit which generates a baseband signal based on an HSDPA (High Speed Downlink Packet Access) (R5: Release 5) scheme which is expected to be commercialized in the near future. The same reference numerals as in FIG. 10 denote the same parts in FIG. 12. In Release 5, HS(High Speed)-DPCCH, which is a new control channel, is additionally provided as a response channel for a high speed downlink data channel, as shown in FIG. 12. An HS-DPCCH signal is an uplink control channel for HSDPA, and is a binary signal of ±1. A multiplier 139 multiplies this signal by a spreading code Chs (which is also a binary signal of ±1). A multiplier 140 multiplies the resultant signal by a weighting factor βhs. With the addition of this HS-DPCCH, the PAR increases to about 5 dB.

According to HSUPA (High Speed Uplink Packet Access) (R6: Release 6) which is expected to be adopted in the future, the number of code channels greatly increases, as shown in FIG. 13. The same reference numerals as in FIG. 12 denote the same parts in FIG. 13. In addition to DPDCH, high-speed data channels E-DPDCH1 to E-DPDCH4 are additionally provided, which are respectively spread by unique spreading codes Ced,1 to Ced,4 (multipliers 141, 143, 145, and 147) and respectively weighted by unique weighting factors βed,1 to βed,4 (multipliers 142, 144, 146, and 148).

In addition, a control channel E-DPCCH for controlling these communications is additionally provided. The control channel E-DPCCH is spread by a unique spreading code Cec (a multiplier 149) and weighted by a unique weighting factor βec (a multiplier 150). FIG. 11B shows a constellation in a case in which the ratios between weighting factors are βc=βhs=βec=8/15, βd=0, βed1=βed2=15/15, and βed3=βed4=11/15. Compared with R99, the gap between the peak value and the RMS value is large, and the PAR is about 7 dB. That is, the PAR is larger than that in R99 by as large as 4.6 dB.

Compared with R99, therefore, HSUPA cannot meet the adjacent channel leakage power standard when amplification is performed by the same amplifier, because a large distortion occurs at an amplitude peak, unless the transmission power is decreased. A dB value indicating how much the transmission power should be decreased to meet the adjacent channel leakage power standard is called a back-off. Since R99 is currently in practical use, a dB value indicating how much the transmission power is decreased as compared with R99 to obtain the same adjacent channel leakage power as that in R99 is called a back-off relative to R99. This value will be simply referred to as a back-off hereinafter.

DISCLOSURE OF INVENTION

Problem to be Solved by the Invention

A PAR value is an index which is analogous to a back-off, but does not always coincide with it. This is because, the back-off changes depending on the probability distribution of peak values. A back-off value is almost determined by a combination of β (weighting factors). In R99 and HSDP, the number of combinations of β is not very large. In HSUPA, however, there are several million combinations of β because of a great increase in the number of code channels. It is impossible to generate a table by calculating back-off values for all the combinations.

The technique disclosed in reference 1 (Japanese Patent Laid-Open No. 2005-252388) is a technique conforming to HSDPA in 3GPP (3rd Generation Partnership Project). As shown in FIG. 12, this technique considers only one to three channels, and is designed to simply reduce the maximum transmission power in a plurality of steps on the basis of a gain factor ratio. The gain factors in this case are βd, βc, and βhs in FIG. 12. This technique is designed to decrease transmission power by determining a plurality of reduction amounts in accordance with these combinations, thereby improving an ACLR (Adjacent Channel Leakage Power Ratio). This technique is also a scheme using a table in which reduction amounts are determined in correspondence with the above combinations of gain factors.

In the case of HSUPA, as described above, since the number of code channels greatly increases, several million combinations are required, and it is impossible to generate a table. The same applies to the technique disclosed in reference 2 (Japanese Patent Laid-Open No. 2005-318266). When the number of code channels greatly increases as in HSUPA, this technique is inadequate.

The present invention has been made to solve this problem, and has as its object to provide a distortion control device and method which can easily control transmission power to improve an ACLR without using any table.

Means of Solution to the Problem

A distortion control device according to the present invention comprises waveform analyzing means for calculating an estimated value of a back-off value required by a power amplifier, which amplifies a high-frequency signal generated from a baseband signal to a predetermined transmission power, by analyzing a waveform of the baseband signal, and control means for controlling at least one of an amplitude of high-frequency power input to the power amplifier and supply power of the power amplifier on the basis of an estimated value calculated by the waveform analyzing means.

A distortion control method according to the present invention comprises the steps of calculating an estimated value of a back-off value required by a power amplifier, which amplifies a high-frequency signal generated from a baseband signal to a predetermined transmission power, by analyzing a waveform of the baseband signal, and controlling at least one of an amplitude of high-frequency power input to the power amplifier and supply power of the power amplifier on the basis of a calculated estimated value.

Effects of the Invention

According to the present invention, since the estimated value of a back-off value is calculated by analyzing the waveform of a baseband signal, there is no need to generate a table in advance by calculating a back-off value in advance for each combination of code channels. The present invention can therefore be applied to even a case in which the number of code channels greatly increases, and can effectively prevent an increase in adjacent channel leakage power due to a signal obtained by multiplexing these code channels.

BRIEF DESCRIPTION OF DRAWINGS

FIG. 7 is a block diagram showing the arrangement of another exemplary embodiment of the present invention when the present invention is applied to the transmitter shown in FIG. 6;
FIG. 9 is a block diagram showing the arrangement of the transmission-side circuit of a mobile terminal apparatus based on a general W-CDMA scheme.

BEST MODE FOR CARRYING OUT THE INVENTION

The principle of the exemplary embodiments of the present invention will be described first. The exemplary embodiment of the present invention uses a technique called Cubic Metric (to be simply referred to as CM) as a method using no table like that described above. The following is a calculation method based on this CM method.

A transmission waveform x(t) is given by $$x(t) = V(t) \cdot \cos\{\omega c \cdot t + \phi(t)\}$$

where V(t) is an amplitude, and φ(t) is a phase. In CM, only an amplitude is used.

First of all, RCM (Raw Cubic Metric) is defined.

$$RCM = 20 \cdot \log_{10}\{rms[V^3_{norm}(t)]\}$$

where $V_{norm}(t)$ is given by $$V_{norm}(t) = |V(t)|/rms[V(t)]$$

As a consequence, RCM is given by $$RCM = 20 \cdot \log_{10}\left\{rms\left[\frac{|V(t)|^3}{rms[V(t)]^3}\right]\right\} \quad \text{[equation 1]}$$
$$= 20 \cdot \log_{10}\left\{rms\left[\frac{rms[|V(t)|^3]}{rms[V(t)]^3}\right]\right\}$$
$$= 10 \cdot \log_{10}\left\{\frac{\overline{V(t)^6}}{\overline{V(t)^2}^3}\right\}$$

The numerator in the log is the sextic moment of an amplitude probability density function, and the denominator is the cube of average power (quadratic moment). Therefore, RCM is a variable determined when at least an amplitude probability density function is determined. With this setting, CM is obtained as follows:

$$CM=\{RCM(Target)-RCM(R99)\}/\kappa$$

In this case, RCM(Target) is the RCM of a baseband arrangement for which CM is to be calculated, and RCM (R99) is the RCM of the R99 system. The value of RCM(R99) is almost 1.52. The value of κ is experimentally determined to an optimal value. For example, κ=1.56 and κ=1.88 may be switched depending on a baseband arrangement. The CM value calculated in this manner indicates an excellent approximation as a back-off value relative to R99, and hence is used to perform back-off control and reduce distortion in the exemplary embodiment of the present invention.

Figure 1:
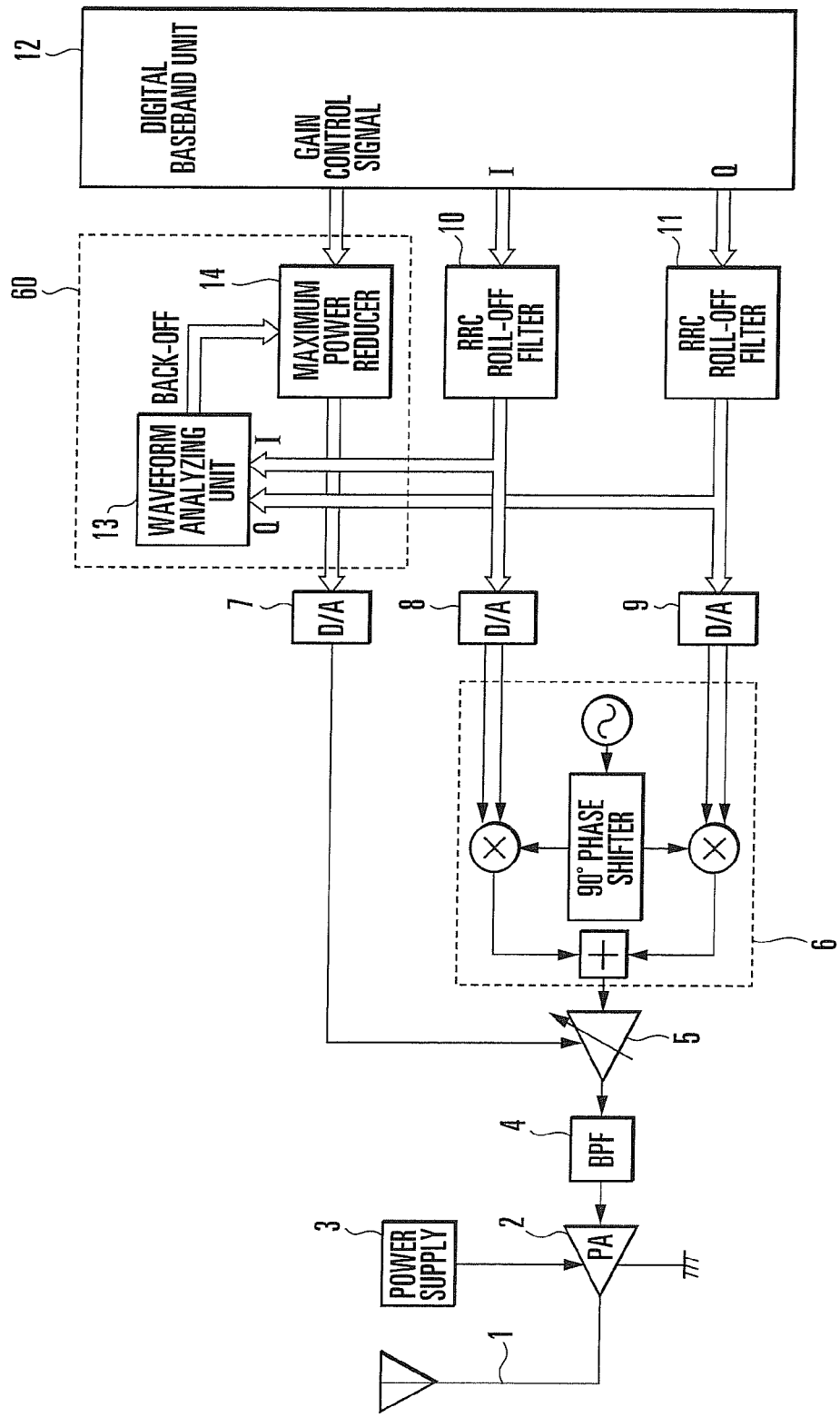
FIG. 1 is a block diagram showing the arrangement of an exemplary embodiment of the present invention.

The exemplary embodiment of the present invention which uses the above CM method will be described below specifically with reference to the accompanying drawings. FIG. 1 shows the arrangement of the transmitter of a mobile terminal apparatus based on the W-CDMA scheme according to an exemplary embodiment of the present invention. This transmitter comprises an antenna 1, a power amplifier (PA) 2, a power supply 3, a bandpass filter (BPF) 4, a variable gain amplifier 5, a quadrature modulator (frequency converter) 6, D/A converters 7, 8, and 9, RRC roll-off filters 10 and 11, a digital baseband unit 12, a waveform analyzing unit 13, and a maximum power reducer (a maximum power reducer and gain control means) 14. The waveform analyzing unit 13 and the maximum power reducer 14 constitute a distortion control device 60 as a characteristic feature of this exemplary embodiment.

A baseband signal comprises an in-phase component (to be referred to as an I signal) and a quadrature component (to be referred to as a Q signal) in quadrature modulation. The digital baseband unit 12 generates this signal. The RRC roll-off filters 10 and 11 for waveform shaping band-limit the I and Q signals. The processing so far is digital signal processing.

The D/A converters 8 and 9 then respectively convert the I and Q signals into analog signals. The known quadrature modulator 6 performs quadrature modulation for a local signal with these analog signals. The high-frequency signal generated as a result of this operation is input to the variable gain amplifier 5, which then amplifies it to a predetermined level in accordance with the gain control signal supplied from the digital baseband unit 12 to the variable gain amplifier 5 via the distortion control device 60 and the D/A converter 7.

The high-frequency signal amplified by the variable gain amplifier 5 contains many spurious components. The bandpass filter 4 removes these spurious components. The resultant high-frequency signal is then amplified to a predetermined transmission power by the power amplifier 2 and transmitted from the antenna 1. In practice, circuits such as an isolator, a duplexer, and an antenna switch are arranged between the power amplifier 2 and the antenna 1. These components are not directly associated with this exemplary embodiment, and hence are not illustrated in FIG. 1. Although the power supply 3 drives the power amplifier 2, FIG. 1 shows the voltage of the power supply 3 as a fixed voltage.

The distortion control device 60 will be further described. As described above, the distortion control device 60 comprises the waveform analyzing unit 13 and the maximum power reducer 14. The waveform analyzing unit 13 receives the I and Q baseband signals output from the RRC roll-off filters 10 and 11, performs waveform analysis, and calculates and outputs the estimated value of a required back-off relative to R99 as a result of the waveform analysis. In this case, as a calculation method, the CM method is used. A concrete implementation method for this method will be described with reference to FIG. 2.

Figure 2:
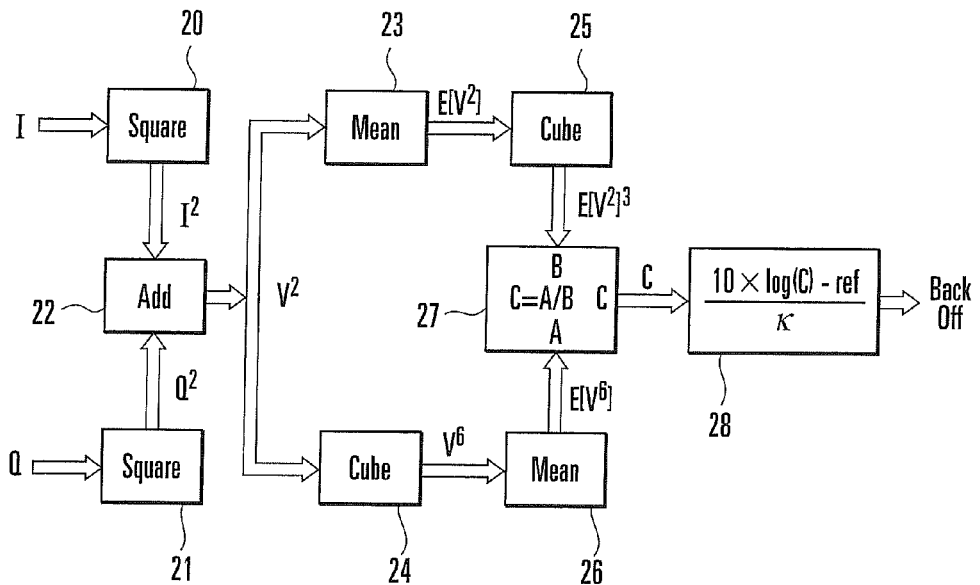
FIG. 2 is a block diagram showing an example of the arrangement of a waveform analyzing unit in FIG. 1.

Square circuits (Square) 20 and 21 respectively square the I and Q signals input from the left side in FIG. 2. An adder (Add) 22 adds these two signals ($I^2$, $Q^2$) and obtains $V^2(I^2+Q^2)$ as the square of the amplitude. A mean circuit (Mean) 23 calculates, for example, the mean of W-CDMA data corresponding to one slot. A cube circuit (Cube) 25 cubes the resultant value. This result is $E[V^2]^3$. This value is the cube of the quadrature moment of the amplitude probability density function. In this case, E[x] represents an expected value of x.

A cube circuit 24 cubes $V^2$ in advance. A mean circuit 26 calculates, for example, the mean of W-CDMA data corresponding to one slot. This result is $E[V^6]$. This value is the sextic moment of an amplitude probability density function. A divider (C=A/B) 27 divides $E[V^6]$ described above by $E[V^2]^3$. An obtained value C is given by $$C=E[V^6]/E[V^2]^3$$

An estimated value calculation unit 28 obtains the dB value of power of the value of C, subtracts a value (offset value) ref as in the case of R99 from the dB value, and divides the value by a predetermined constant κ, thereby outputting the resultant value as the estimated value (dB) of the back-off. In practice, the value obtained by increasing this value in increments of 0.5 dB and subtracting 1 from the resultant value is used as an MPR (Maximum Power Reduction) value. If a negative value is obtained by subtraction of 1, the dB value is set to 0. Note that ref corresponds to RCM(R99)≈1.52.

Figure 3:
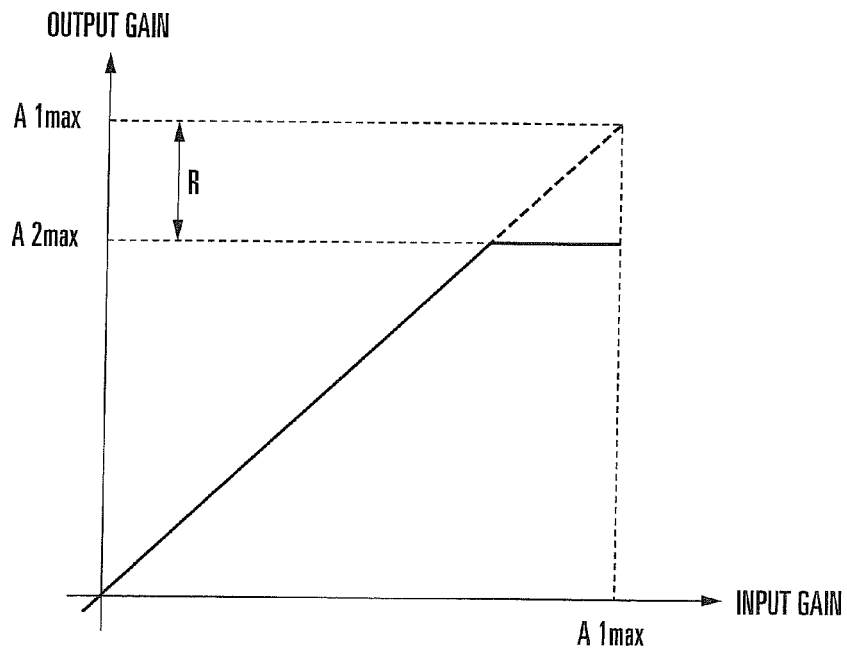
FIG. 3 is a graph for explaining the operation of a maximum power reducer in FIG. 1.

The maximum power reducer 14 receives the back-off value or MPR value output from the waveform analyzing unit 13, and outputs, as an actual gain control signal, the result which limits the value of the gain control signal output from the digital baseband unit 12 so as to prevent it from exceeding the value obtained by subtracting the MPR value from the maximum value, as shown in FIG. 3. Referring to FIG. 3, reference symbol $A1_{max}$ denotes the maximum value (maximum gain) of a gain control signal input to the waveform analyzing unit 13; $A2_{max}$, the maximum value (reduced maximum gain) of the gain control signal output from the waveform analyzing unit 13; and R, the maximum width (gain reduction maximum width) of reduction by the waveform analyzing unit 13. Note that it suffices to use another method of simply reducing a gain control signal by an MPR value.

With this operation, the gain of the variable gain amplifier 5 is limited to equal to or less than a value smaller than the maximum value by the MPR value. With this function, the output of the power amplifier 2 is limited to a value smaller than the maximum output by the MPR value. This can prevent an increase in adjacent channel leakage power due to a signal obtained by multiplexing many code channels, which increase is caused by the distortion of transmission power by the power amplifier.

Figure 4:
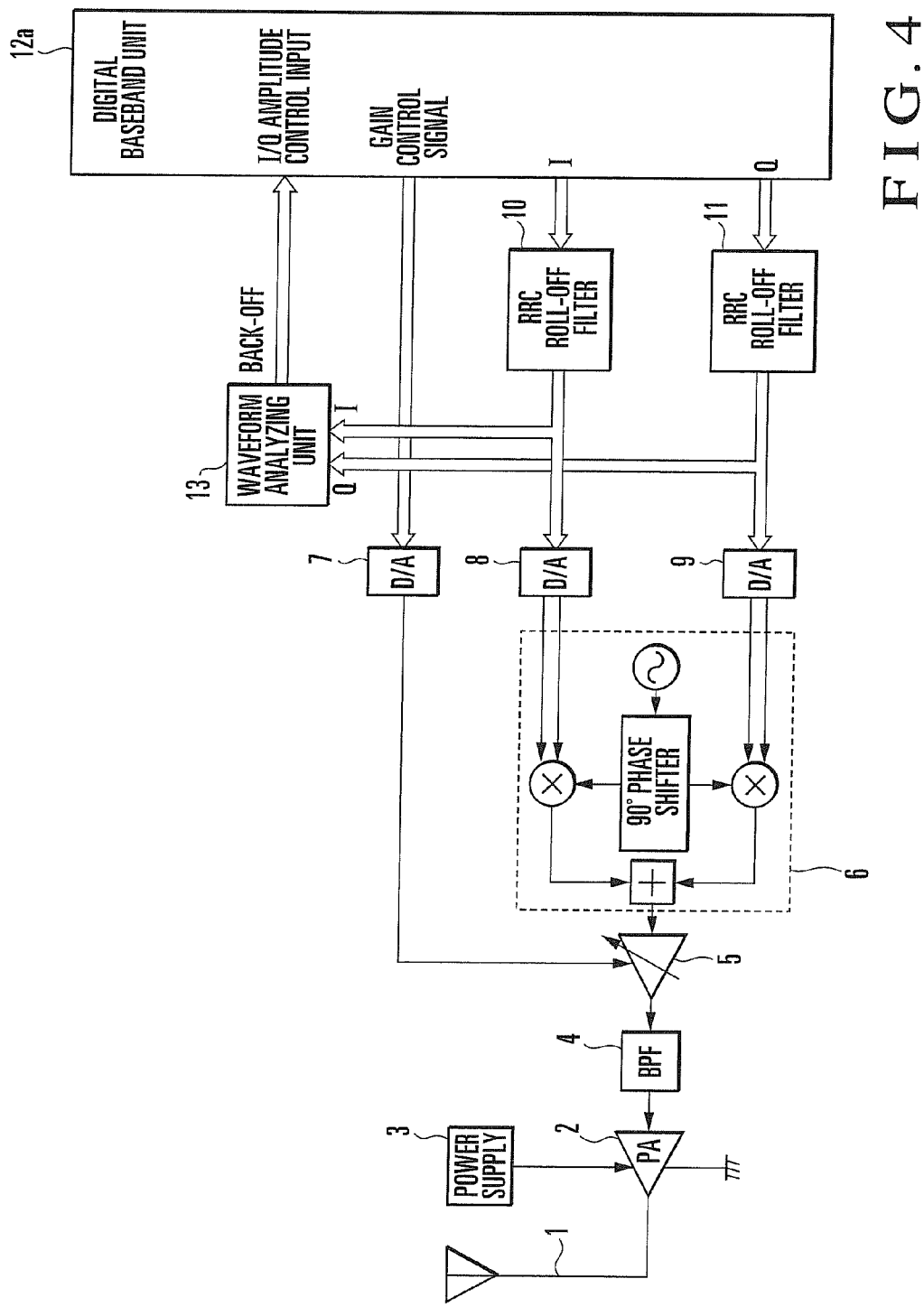
FIG. 4 is a block diagram showing the arrangement of another exemplary embodiment of the present invention.
Figure 5:
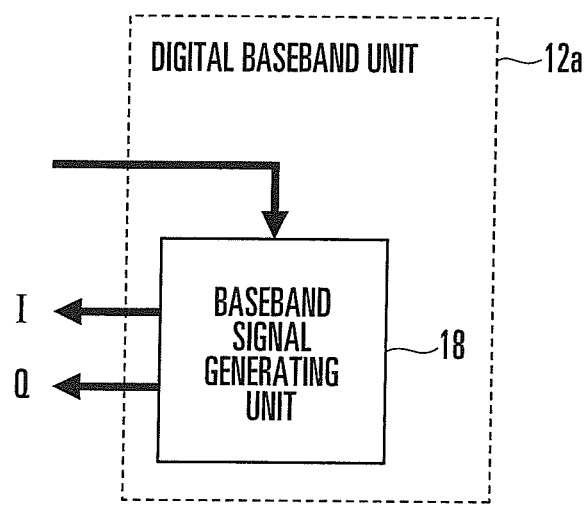
FIG. 5 is a block diagram showing the arrangement of the main part of a digital baseband unit in FIG. 1.

An exemplary embodiment of the present invention will be described next. FIG. 4 shows the arrangement of the transmitter of a mobile terminal apparatus based on the W-CDMA scheme according to another exemplary embodiment of the present invention. The same reference numerals as in FIG. 1 denote the same parts in FIG. 4. As shown in FIG. 5, the transmitter of this exemplary embodiment comprises, inside a digital baseband unit 12a, a baseband signal generating unit (level control means) 18 having a function of controlling the amplitudes of I and Q signals instead of the maximum power reducer 14. In this exemplary embodiment, a waveform analyzing unit 13 and the baseband signal generating unit 18 constitute distortion control device.

The baseband signal generating unit 18 receives the MPR value output from the waveform analyzing unit 13. The baseband signal generating unit 18 outputs the I and Q signals upon attenuating them from the planned level at which they are to be output by the following level.

attenuation amount=MAX{planned output level−(maximum level−MPR),0)}dB where MAX{A, B} is a function which outputs larger one of A and B. In addition, an attenuation amount can be simply set as attenuation amount=MPR.

With this operation, the same effect as that of the exemplary embodiment shown in FIG. 1 can be obtained. A merit of this exemplary embodiment is that it is possible to cope with distortion of transmission power due to the variable gain amplifier 5 as well as a power amplifier 2. Note that the maximum power reducer 14 in FIG. 1 and the baseband signal generating unit 18 in FIG. 5 are common in that control is performed to attenuate the high-frequency power input to the power amplifier 2.

In the above two exemplary embodiments, adjacent channel leakage power due to distortion is prevented by calculating a back-off value or MPR value by analyzing the waveform of a baseband, and reducing the transmission power by a value corresponding to the transmission power. This will always reduce transmission power. In this case, the radius of a cell in which a base station provides services decreases.

If, for example, the transmission power decreases by 1 dB, the radius of the cell becomes 0.89 times based on the assumption of free-space propagation. In terms of area, the cell becomes 0.79 times, i.e., decreases by about 20%. Therefore, a reduction in maximum transmission power by 1 dB means a reduction in the area of the cell by 20%. In other words, it is necessary to install base stations by 20% more. The operator requires extra expenditure, which is reflected in the call charge for the user in the end. It is therefore desirable to perform distortion control without decreasing transmission power if possible.

Figure 6:
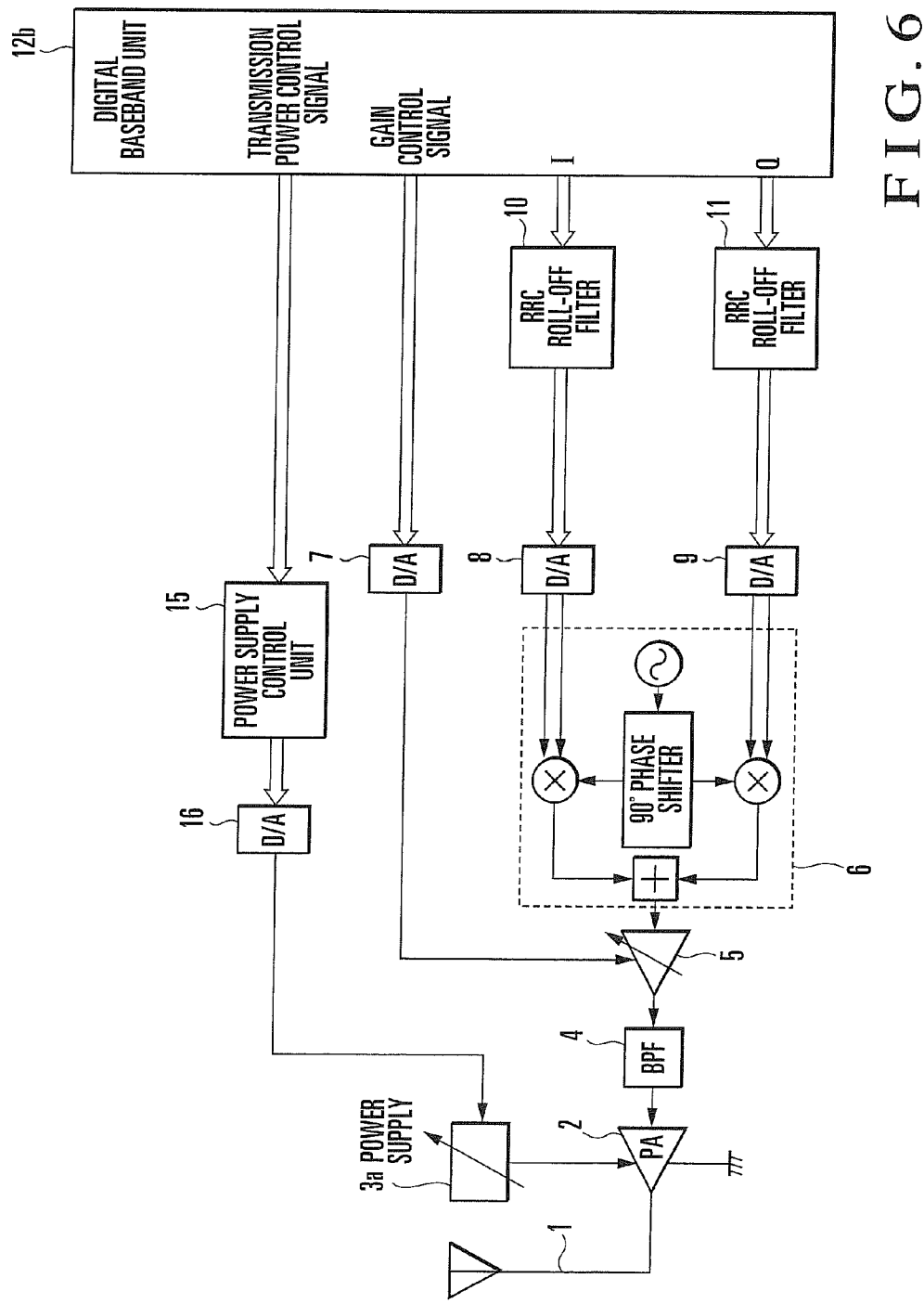
FIG. 6 is a block diagram showing an example of the arrangement of a transmitter which performs power supply control on a power amplifier.

FIG. 6 shows an example of the arrangement of a transmitter which performs power supply control on a power amplifier. The same reference numerals as in FIG. 1 denote the same parts in FIG. 6. Assume that a power supply to be used is a variable voltage power supply 3a. A digital baseband unit 12b outputs a control signal corresponding to transmission power (dB). A power supply control unit 15 converts the control signal into a signal corresponding to the control characteristic of the power supply. A D/A converter 16 converts the control signal from a digital signal to an analog signal. The voltage of the variable voltage power supply 3a is controlled by using the control signal obtained in this manner. The original purpose of this control is to apply, to the power amplifier 2, a minimum necessary power supply voltage which can generate transmission power without any distortion so as to reduce the power consumption of the power amplifier 2. Using this technique makes it possible to greatly reduce current at the time of low-power output.

FIG. 7 shows the arrangement of a transmitter having a distortion control function which is based on the transmitter in FIG. 6. The same reference numerals as in FIGS. 1 and 6 denote the same parts in FIG. 7. In this exemplary embodiment, the waveform analyzing unit 13, an adder 17, and the power supply control unit 15 constitute a distortion control device 61. The adder 17 adds a control signal corresponding to the transmission power (dB) output from the digital baseband unit 12 to the back-off value or MPR value output from the waveform analyzing unit 13. The power supply control unit 15 then controls the variable voltage power supply 3a by using the obtained addition signal.

Figure 8:
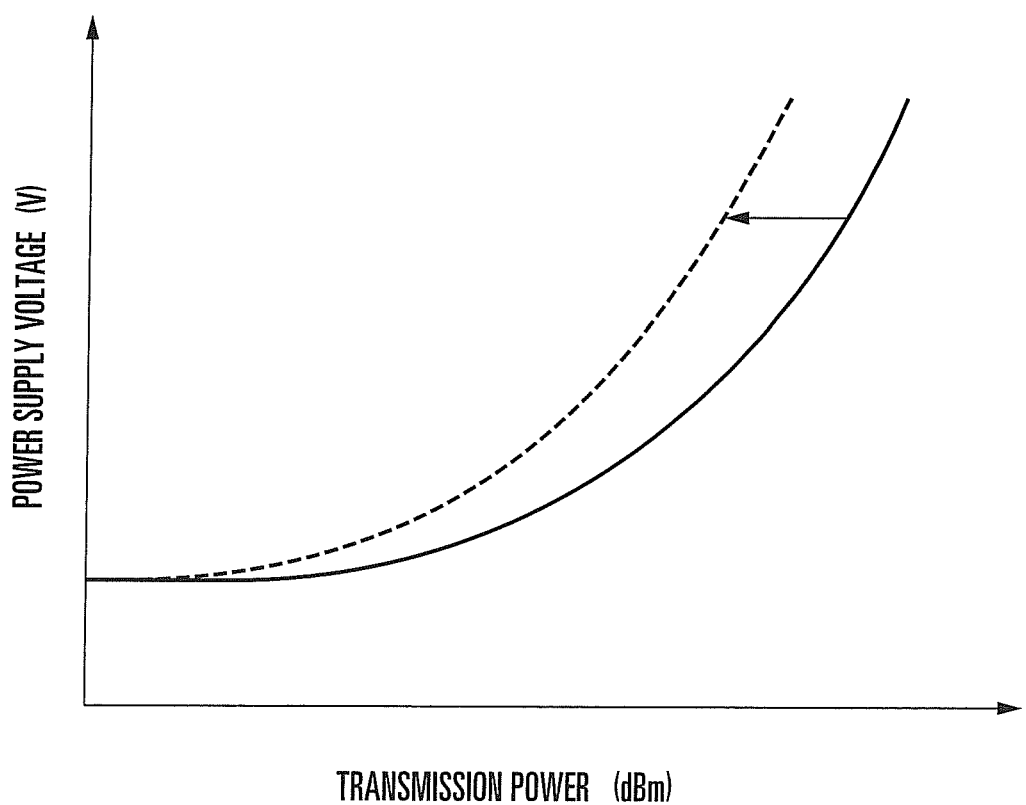
FIG. 8 is a graph for explaining the effects of the exemplary embodiment shown in FIG. 7.
Figure 10:
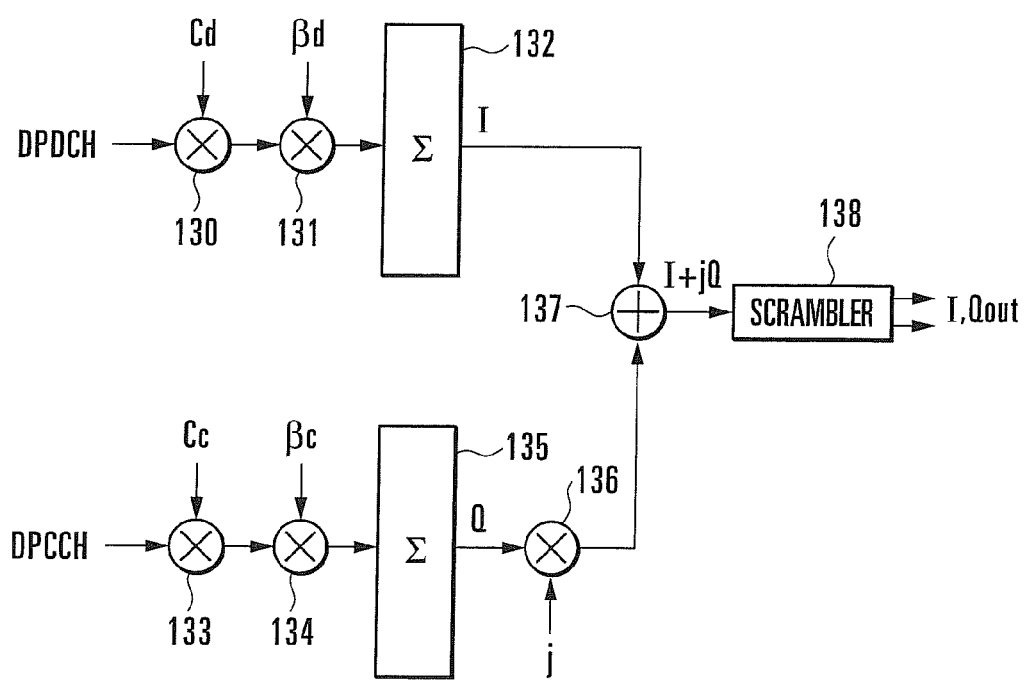
FIG. 10 is a block diagram of a circuit which generates a baseband signal in the mobile terminal apparatus based on the W-CDMA (R99) scheme.
Figure 11A:
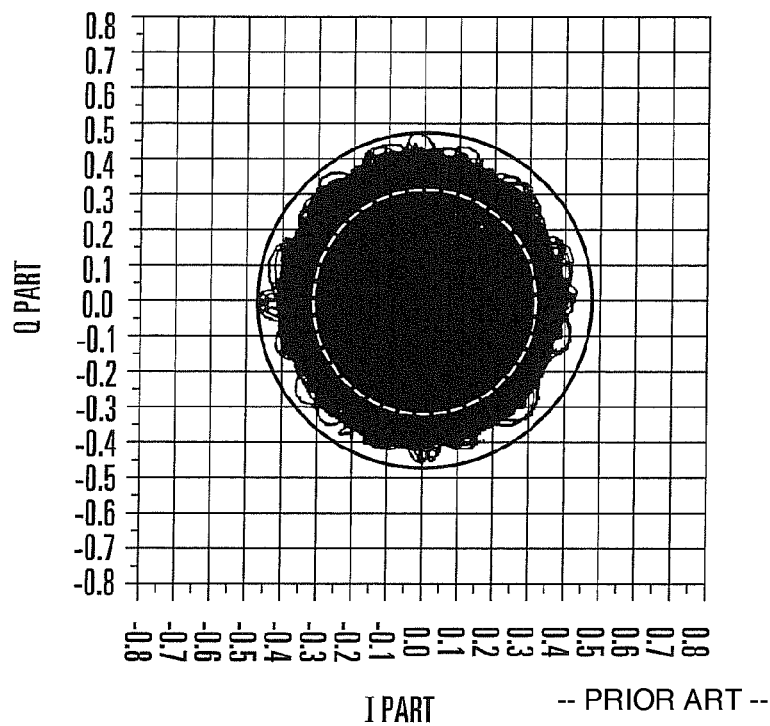
FIG. 11A is a view showing a constellation which is the loci of baseband signals on an IQ plane in the W-CDMA (R99) scheme.
Figure 11B:
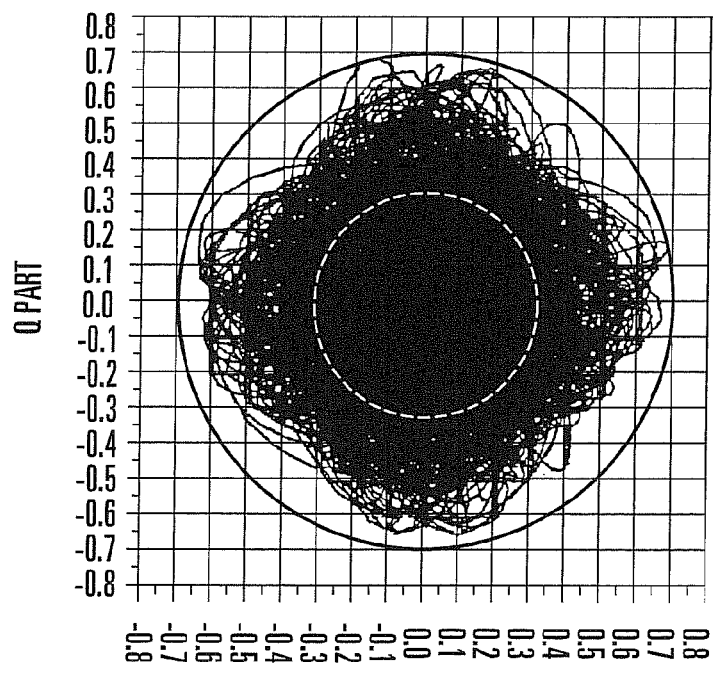
FIG. 11B is a view showing a constellation which is the loci of baseband signals on an IQ plane in the HSUPA (R6) scheme.
Figure 12:
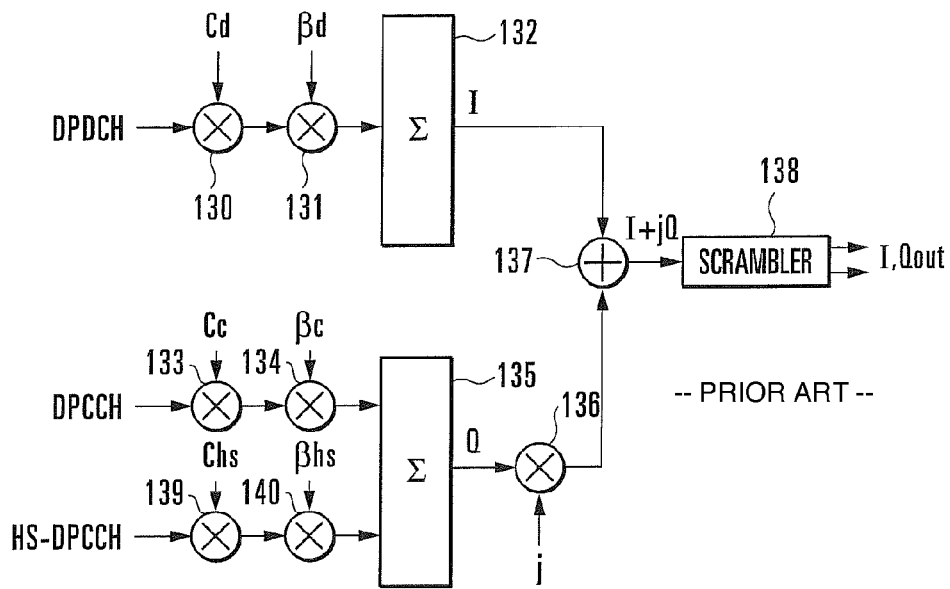
FIG. 12 is a block diagram showing a circuit which generates a baseband signal in a mobile terminal apparatus based on the HSDPA (R5) scheme.
Figure 13:
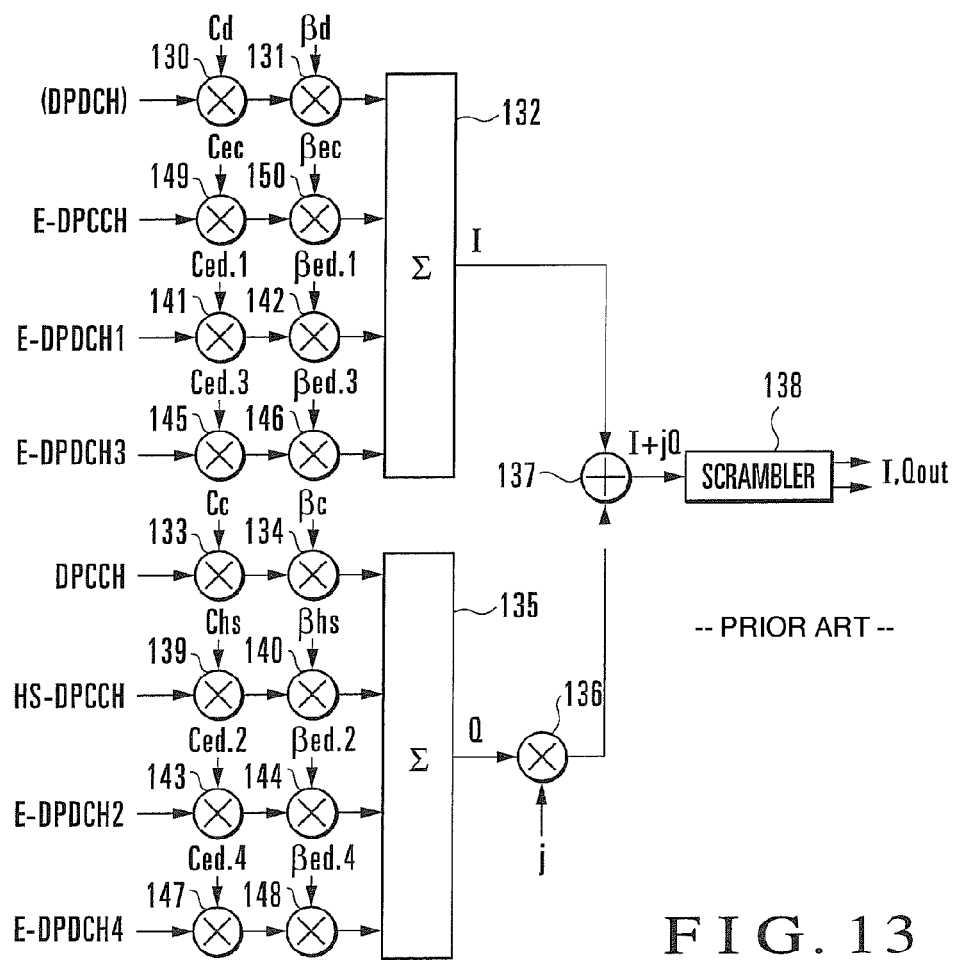
FIG. 13 is a block diagram showing a circuit which generates a baseband signal in a mobile terminal apparatus based on the HSUPA (R6) scheme.

FIG. 8 is a graph showing the effect of this exemplary embodiment. Referring to FIG. 8, the abscissa represents the transmission power (dB) output from the digital baseband unit 12b; and the ordinate, the controlled power supply voltage. The solid line indicates a state in normal times. When the back-off value or MPR value output from the waveform analyzing unit 13 is added, control is performed in the manner indicated by the dotted line. In this manner, the power supply voltage of the power amplifier 2 can be increased by the necessary back-off indicated by the arrow. This can increase the current flowing to the power amplifier 2 and reduce the distortion of transmission power, thereby decreasing the adjacent channel leakage power.

A problem of this exemplary embodiment is that current increases. Unlike in the two exemplary embodiments described above, since no power reduction occurs, this exemplary embodiment is free from the demerit that the area of the cell decreases. In addition, since a DC/DC converter capable of raising/lowering a voltage is commercially available as the variable voltage power supply 3a, it is possible to use this device.

Although the three exemplary embodiments described above can be executed singly, they can be executed in combination. That is, the exemplary embodiment shown in FIG. 1 can be combined with the exemplary embodiment shown in FIG. 7, or the exemplary embodiment shown in FIG. 4 can be combined with the exemplary embodiment shown in FIG. 7. If, for example, MPR values are obliged to be discretely and strictly set in increments of 1 dB or 0.5 dB, it is possible to decrease the transmission power by the method in FIG. 1 or 4 using the discrete value and compensate for a deficient fractional portion by the method in FIG. 7.

The above exemplary embodiments can further comprise a function of calculating the estimated value of a back-off value from a combination of weighting relative values β of a plurality of code channels constituting a baseband signal.

The invention claimed is:

1. A distortion control device comprising:
a variable gain amplifier which amplifies a high-frequency signal generated from a baseband signal that is output from a digital baseband unit according to a control signal and outputs the amplified signal to a power amplifier which amplifies the amplified signal output from the variable gain amplifier to a predetermined transmission power;
a waveform analyzing unit which calculates an estimated value of a back-off value by analyzing a waveform of the baseband signal that is output from the digital baseband unit; and
a control unit which generates the control signal by subtracting based on the estimated value calculated by the waveform analyzing unit from at least a maximum value of a gain control signal that is output from the digital baseband unit and outputs the control signal to the variable gain amplifier.

2. A distortion control device according to claim 1, wherein said waveform analyzing unit calculates the estimated value by using a CM (Cubic Metric) method.

3. A distortion control device according to claim 1, wherein said waveform analyzing unit obtains a variable associated with an amplitude probability density function from amplitude data of the baseband signal, and calculates and outputs the estimated value of the back-off value from the variable.

4. A distortion control device according to claim 3, wherein said waveform analyzing unit obtains, as the variable, a first value which is obtained by dividing a sextic moment of the amplitude probability density function by a cube of a quadrature moment of the amplitude probability density function and is represented by a dB value of power, and outputs, as the estimated value, a second value obtained by dividing, by a predetermined constant, a third value obtained by subtracting a predetermined offset value from the first value of the variable.

5. A distortion control device according to claim 1, wherein the estimated value of the back-off value is calculated from a combination of weighting relative values of a plurality of code channels constituting the baseband signal.

6. A distortion control device according to claim 1, wherein said device is used in a transmitter which amplifies the high-frequency signal generated from the baseband signal to the predetermined transmission power by using the power amplifier and transmits the power amplified signal.

7. A transmitter comprising:
a high-frequency converter which generates a high-frequency signal by converting a baseband signal that is output from a digital baseband unit;
a variable gain amplifier which amplifies the high-frequency signal output from said high-frequency frequency converter, according to a control signal, and which outputs the amplified signal;
a power amplifier which amplifies the amplified signal output from said variable gain amplifier to a predetermined transmission power;
an antenna which transmits the power amplified signal output from said power amplifier; and
a distortion control device which controls distortion of transmission power of said power amplifier,
said distortion control device comprising:
a waveform analyzing unit which calculates an estimated value of a back-off value by analyzing a waveform of said baseband signal that is output from the digital baseband unit, and
a control unit which generates the control signal by subtracting the estimated value calculated by the waveform analyzing unit from at least a maximum value of a gain control signal that is output from the digital baseband unit and outputs the control signal to the variable gain amplifier.

8. A distortion control method comprising the steps of:
amplifying a high-frequency signal generated from a baseband signal that is output from a digital baseband unit according to a control signal, by a variable gain amplifier;
outputting the amplified signal to a power amplifier, by the variable gain amplifier;
amplifying the amplified signal output from the variable gain amplifier to a predetermined transmission power, by the power amplifier;
calculating an estimated value of a back-off value by analyzing a waveform of the baseband signal that is output from the digital baseband unit; and
generating the control signal by subtracting the estimated value from at least a maximum value of a gain control signal that is output from the digital baseband unit and outputting the control signal to the variable gain amplifier.

9. A distortion control method according to claim 8, wherein the calculating step comprises the step of calculating the estimated value by using a CM (Cubic Metric) method.

10. A distortion control method according to claim 8, wherein the calculating step comprises the steps of
obtaining a variable associated with an amplitude probability density function from amplitude data of the baseband signal, and
calculating and outputting the estimated value of the back-off value from the obtained variable.

11. A distortion control method according to claim 10, wherein
the obtaining step comprises the step of obtaining, as the variable, a first value which is obtained by dividing a sextic moment of the amplitude probability density function by a cube of a quadrature moment of the amplitude probability density function and is represented by a dB value of power, and
the outputting step comprises the step of outputting, as the estimated value, a second value obtained by dividing, by a predetermined constant, a third value obtained by subtracting a predetermined offset value from the first value of the variable.

12. A distortion control method according to claim 8, further comprising the step of calculating the estimated value of the back-off value from a combination of weighting relative values of a plurality of code channels constituting the baseband signal.

13. A distortion control device comprising:
first means for amplifying a high-frequency signal generated from a baseband signal that is output from a digital baseband unit according to a control signal and for outputting an amplified signal;
second means for amplifying the amplified signal that has been output to a predetermined transmission power;
means for calculating an estimated value of a back-off value by analyzing a waveform of the baseband signal that is output from the digital baseband unit; and
means for generating the control signal by subtracting the estimated value from at least a maximum value of a gain control signal that is output from the digital baseband unit and outputting the control signal to the first means for amplifying the high-frequency signal.

14. A transmitter comprising:
a high-frequency converter which generates a high-frequency signal by converting a baseband signal that is output from a digital baseband unit;
a variable gain amplifier which amplifies the high-frequency signal output from said high-frequency converter, according to a control signal, to output the amplified signal;
a power amplifier which amplifies the amplified signal output from said variable gain amplifier to a predetermined transmission power;
an antenna which transmits the power amplified signal output from said power amplifier; and
a distortion control device which controls distortion of transmission power of said power amplifier,
said distortion control device comprising
means for calculating an estimated value of a back-off value by analyzing a waveform of the baseband signal that is output from the digital baseband unit, and
means for generating the control signal by subtracting the estimated value calculated from at least a maximum value of a gain control signal that is output from the digital baseband unit and for outputting the control signal to the variable gain amplifier.

* * * * *